United States Patent
Koudele et al.

(10) Patent No.: US 11,705,208 B2
(45) Date of Patent: Jul. 18, 2023

(54) READ LEVEL CALIBRATION IN MEMORY DEVICES USING EMBEDDED SERVO CELLS

(71) Applicant: Micron Technology, Inc., Boise, ID (US)

(72) Inventors: Larry J. Koudele, Erie, CO (US); Bruce A. Liikanen, Berthoud, CO (US); Michael Sheperek, Longmont, CO (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/530,368

(22) Filed: Nov. 18, 2021

(65) Prior Publication Data
US 2022/0076763 A1    Mar. 10, 2022

Related U.S. Application Data

(63) Continuation of application No. 16/856,587, filed on Apr. 23, 2020, now Pat. No. 11,200,956.

(51) Int. Cl.
*G11C 16/26* (2006.01)
*G06F 12/02* (2006.01)
*G11C 16/10* (2006.01)
*G11C 16/04* (2006.01)

(52) U.S. Cl.
CPC .......... *G11C 16/26* (2013.01); *G06F 12/0223* (2013.01); *G11C 16/10* (2013.01); *G06F 2212/1008* (2013.01); *G11C 16/0483* (2013.01)

(58) Field of Classification Search
CPC ..... G11C 16/26; G11C 16/10; G11C 16/0483; G06F 12/0223; G06F 2212/1008
USPC .......................................................... 711/154
See application file for complete search history.

(56) References Cited

U.S. PATENT DOCUMENTS

| | | | |
|---|---|---|---|
| 7,471,542 B2 | 12/2008 | Kanda et al. | |
| 10,140,040 B1 * | 11/2018 | Koudele | G11C 29/021 |
| 10,347,344 B2 * | 7/2019 | Malshe | G11C 16/349 |
| 10,452,480 B2 * | 10/2019 | Koudele | G11C 29/52 |
| 10,453,537 B1 * | 10/2019 | Reuter | G11C 16/3404 |
| 10,529,433 B1 * | 1/2020 | Liikanen | G11C 16/0483 |
| 10,699,791 B2 * | 6/2020 | Pletka | G06F 3/0604 |
| 11,036,415 B2 * | 6/2021 | Papandreou | G06F 3/0659 |
| 11,200,956 B2 * | 12/2021 | Koudele | G11C 29/021 |
| 2015/0039842 A1 | 2/2015 | Fitzpatrick et al. | |
| 2017/0345510 A1 | 11/2017 | Achtenberg et al. | |
| 2018/0294036 A1 * | 10/2018 | Oh | G11C 29/028 |
| 2019/0042356 A1 * | 2/2019 | Chen | G11C 16/26 |

(Continued)

OTHER PUBLICATIONS

USPTO, Office Action for U.S. Appl. No. 16/856,587, dated Apr. 6, 2021.

(Continued)

*Primary Examiner* — Viet Q Nguyen
(74) *Attorney, Agent, or Firm* — Lowenstein Sandler LLP

(57) ABSTRACT

An example memory sub-system includes a memory device and a processing device, operatively coupled to the memory device. The processing device is configured to identify a set of embedded servo cells stored on the memory device; determine a read voltage offset by performing read level calibration based on the set of embedded servo cells; and apply the read voltage offset for reading a memory page associated with the set of embedded servo cells.

18 Claims, 6 Drawing Sheets

(56) References Cited

U.S. PATENT DOCUMENTS

| | | | |
|---|---|---|---|
| 2019/0102097 A1* | 4/2019 | Madraswala | G06F 3/0679 |
| 2019/0198097 A1* | 6/2019 | Kim | G11C 7/14 |
| 2019/0267104 A1* | 8/2019 | Lee | G11C 7/18 |
| 2019/0391746 A1* | 12/2019 | Papandreou | G06F 3/0679 |
| 2020/0066353 A1 | 2/2020 | Pletka et al. | |
| 2020/0089569 A1 | 3/2020 | Cadloni et al. | |
| 2020/0159464 A1 | 5/2020 | Park | |
| 2020/0301768 A1* | 9/2020 | Papandreou | G06F 11/076 |
| 2020/0319964 A1 | 10/2020 | Kim | |
| 2021/0065813 A1* | 3/2021 | Papandreou | G11C 16/3404 |

OTHER PUBLICATIONS

USPTO, Notice of Allowance for U.S. Appl. No. 16/856,587, dated Aug. 12, 2021.

* cited by examiner

READ LEVEL CALIBRATION IN MEMORY DEVICES USING EMBEDDED SERVO CELLS

RELATED APPLICATIONS

This application is a continuation of U.S. patent application Ser. No. 16/856,587 filed on Apr. 23, 2020, the entire content of which is incorporated by reference herein.

TECHNICAL FIELD

Embodiments of the disclosure are generally related to memory sub-systems, and more specifically, are related to read level calibration in memory devices using embedded servo cells.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of some embodiments of the disclosure.

DETAILED DESCRIPTION

Figure 1:
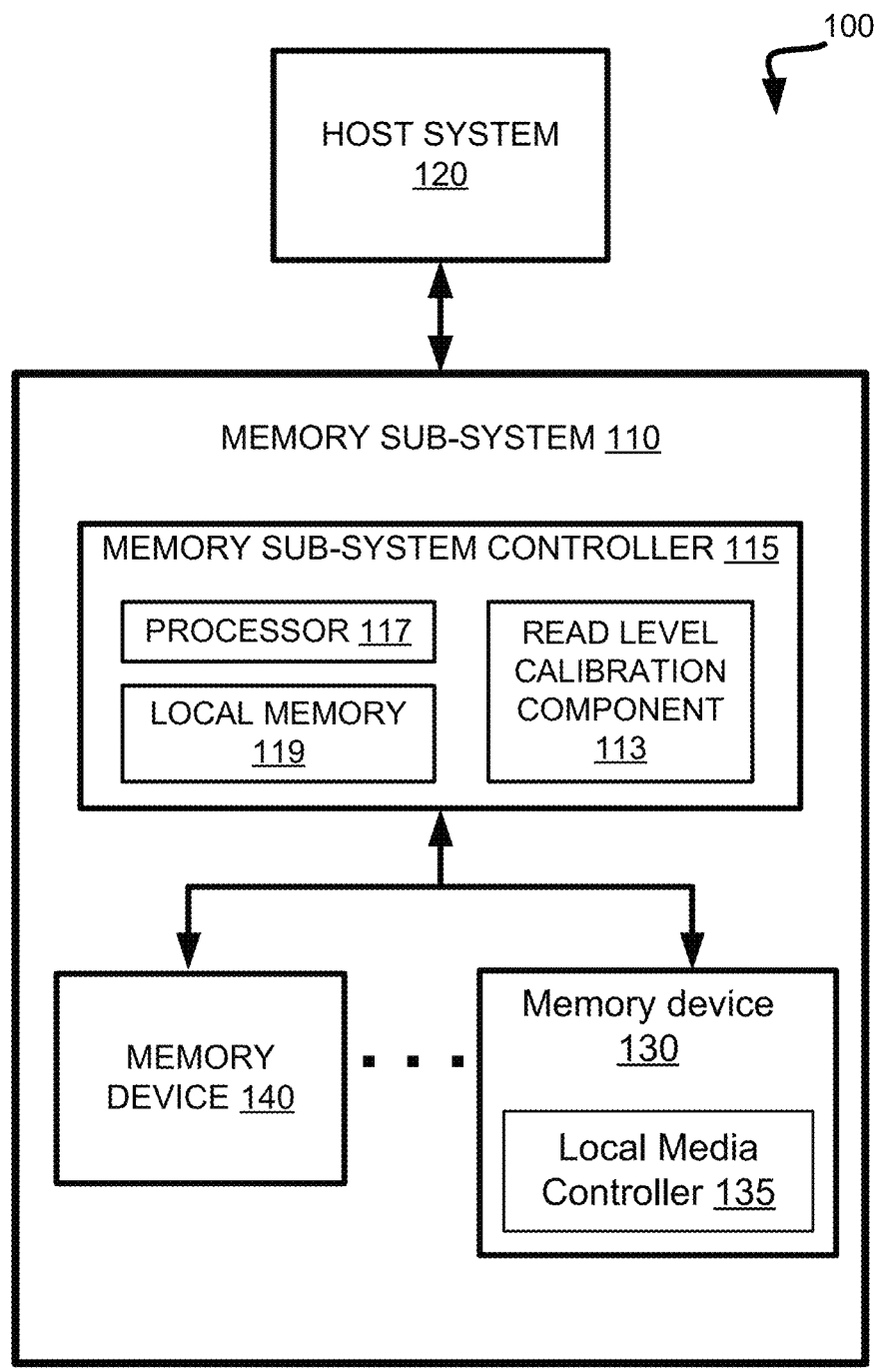
FIG. 1 illustrates an example computing system that includes a memory sub-system in accordance with some embodiments of the present disclosure.

Embodiments of the present disclosure are directed to read level calibration in memory devices using embedded servo cells. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can utilize one or more memory devices, including any combination of the different types of non-volatile memory devices and/or volatile memory devices, to store the data provided by the host system. In some embodiments, non-volatile memory devices can be provided by negative-and (NAND) type flash memory devices. Other examples of non-volatile memory devices are described below in conjunction with FIG. 1. A non-volatile memory device can include a package of one or more dies. Each die can include one or more planes. Planes can be groups into logic units (LUN). For some types of non-volatile memory devices (e.g., NAND devices), each plane includes a set of physical blocks. Each block includes a set of pages. Each page includes a set of memory cells ("cells"). A cell is an electronic circuit that stores information.

Data operations can be performed by the memory sub-system. The data operations can be host-initiated operations. For example, the host system can initiate a data operation (e.g., write, read, erase, etc.) on a memory sub-system. The host system can send access requests (e.g., write command, read command) to the memory sub-system, such as to store data on a memory device at the memory sub-system and to read data from the memory device on the memory sub-system. The data to be read or written, as specified by a host request, is hereinafter referred to as "host data". A host request can include logical address information (e.g., logical block address (LBA), namespace) for the host data, which is the location the host system associates with the host data. The logical address information (e.g., the LBA and the namespace) can be part of metadata for the host data. Metadata can also include error handling data (e.g., ECC codeword, parity code), data version (e.g. used to distinguish age of data written), valid bitmap (which LBAs or logical transfer units contain valid data), etc.

A memory device includes multiple memory cells, each of which can store, depending on the memory cell type, one or more bits of information. A memory cell can be programmed (written to) by applying a certain voltage to the memory cell, which results in an electric charge being held by the memory cell, thus allowing modulation of the voltage distributions produced by the memory cell. Moreover, precisely controlling the amount of the electric charge stored by the memory cell allows establishing multiple threshold voltage levels corresponding to different logical levels, thus effectively allowing a single memory cell to store multiple bits of information: a memory cell operated with $2^n$ different threshold voltage levels is capable of storing n bits of information. "Threshold voltage" herein shall refer to the voltage level that defines a boundary between two neighboring voltage distributions corresponding to two logical levels. Thus, the read operation can be performed by comparing the measured voltage exhibited by the memory cell to one or more reference voltage levels in order to distinguish between two logical levels for single-level cells and between multiple logical levels for multi-level cells.

Due to the phenomenon known as slow charge loss, the threshold voltage of a memory cell can change in time as the electric charge of the cell is degrading, which is referred to as "temporal voltage shift" (since the degrading electric charge causes the voltage distributions to shift along the voltage axis towards lower voltage levels). The threshold voltage is changing rapidly at first (within a short time period after the memory cell was programmed), and then slows down in an approximately logarithmic linear fashion with respect to the time elapsed since the cell programming event. Accordingly, failure to mitigate the temporal voltage shift caused by the slow charge loss can result in the increased bit error rate in read operations.

However, various common memory systems either fail to adequately address the temporal voltage shift or employ inefficient strategies resulting in high bit error rates, inefficient calibration process, and/or exhibiting other shortcomings. Embodiments of the present disclosure address the above-noted and other deficiencies by implementing a memory sub-system that utilizes embedded servo cells for read level calibration, thus significantly improving the efficiency of calibration process and the bit error rate exhibited by the memory sub-system.

In accordance with embodiments of the present disclosure, certain memory cells residing at known locations of the memory device (e.g., one or more groups residing at known offsets within each memory page) are designated as "embedded servo cells," which, instead of storing the host data, are programmed to store known data patterns. The embedded servo cells may be programmed in groups of adjacent cells or as individual cells that are spread throughout the data cells of the memory device.

Since both the embedded servo cells and regular data cells within a memory page are presumed to exhibit similar threshold voltage distributions, they would require the same voltage offset to be applied to the base read levels for read operations. "Base read level" herein shall refer to the initial threshold voltage level exhibited by the memory cell immediately after programming. In some implementations, base read levels can be stored in the metadata of the memory device.

In order to determine the read level offset, the memory sub-system controller can perform read level calibration by decoding the embedded servo cells. Since the embedded servo cells stored known data, the calibration process may be performed very efficiently, by comparing the known data to the data that has been read at the current read level voltage and determining the read level voltage that would minimize the bit error rate. In various illustrative examples, the calibration process can be performed periodically, in response to a certain triggering event, or immediately before each read operation. The computed read level offset can then be utilized for performing read operations with respect to the same memory page in which the embedded servo cells reside: the memory sub-system controller can compute the new threshold voltage by additively applying the threshold voltage offset to the base read level, and perform the read operation using the new threshold voltage, as described in more detail herein below.

Therefore, advantages of the systems and methods implemented in accordance with some embodiments of the present disclosure include, but are not limited to, improving the efficiency of calibration process and the bit error rate in read operations by performing read level calibration by decoding embedded servo cells storing known data and residing at known locations of the memory device. In various embodiments, the read level calibration can be performed by the media controller residing on the memory device or by the memory sub-system controller. The embedded servo cells do not in any way adversely affect the data cells, and the memory device and/or the memory sub-system controller may choose whether or not use the embedded servo cells for read level calibration. Furthermore, the read level calibration performed in accordance with aspects of the present disclosure significantly improves the bit error rate, by tracking the voltage threshold shift caused by slow charge loss and/or temperature as well as compensating for the program and read disturb and/or physical defects of the storage media, as described in more detail herein below.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device (e.g., a processor).

The computing system 100 can include a host system 120 that is coupled to one or more memory sub-systems 110. In some embodiments, the host system 120 is coupled to different types of memory sub-systems 110. FIG. 1 illustrates one example of a host system 120 coupled to the memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory devices such as 3D cross-point array of non-volatile memory cells and NAND type memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 does not include a controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

In some implementations, memory sub-system 110 can use a striping scheme, according to which every the data payload (e.g., user data) utilizes multiple dies of the memory devices 130 (e.g., NAND type flash memory devices), such that the payload is distributed through a subset of dies, while the remaining one or more dies are used to store the error correction information (e.g., parity bits). Accordingly, a set of blocks distributed across a set of dies of a memory device using a striping scheme is referred herein to as a "superblock."

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 includes a read level calibration component 113 that can be used to implement the read level calibration using embedded servo cells in accordance with embodiments of the present disclosure. In some embodiments, the controller 115 includes at least a portion of the read level calibration component 113. For example, the controller 115 can include a processor 117 (processing device) configured to execute instructions stored in local memory 119 for performing the operations described herein. In some embodiments, the read level calibration component 113 is part of a local media controller 135. The read level calibration component 113 can decode the embedded servo cells and perform read level calibration, as described in more detail herein below.

As noted herein above, a memory cell can be programmed (written to) by applying a certain voltage to the memory cell, which results in an electric charge being held by the memory cell, thus allowing modulation of the voltage distributions produced by the memory cell. Precisely controlling the amount of the electric charge stored by the memory cell allows to establish multiple threshold voltage levels corresponding to different logical levels, thus effectively allowing a single memory cell to store multiple bits of information: a memory cell operated with $2^n$ different threshold voltage levels is capable of storing n bits of information. Due to the phenomenon known as slow charge loss, the threshold voltage of a memory cell can change in time as the electric charge of the cell is degrading, which is referred to as "temporal voltage shift" (since the degrading electric charge causes the voltage distributions to shift along the voltage axis towards lower voltage levels).

Figure 2:
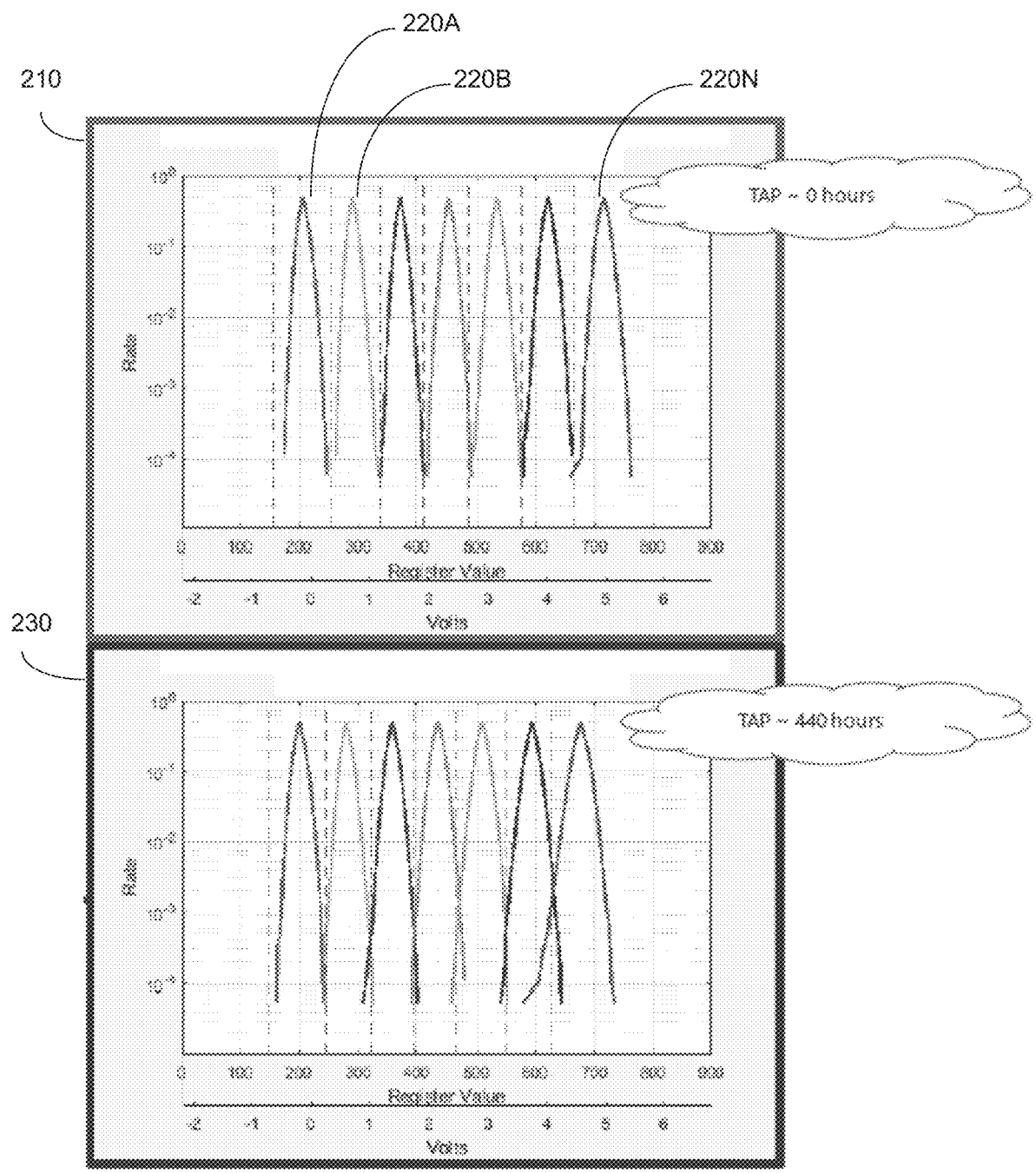
FIG. 2 schematically illustrates the temporal voltage shift caused by the slow charge loss exhibited by triple-level memory cells, in accordance with some embodiments of the present disclosure.

FIG. 2 schematically illustrates the temporal voltage shift caused by the slow charge loss exhibited by triple-level memory cells. While the illustrative example of FIG. 2 utilizes triple-level cells, the same observations can be made and, accordingly, the same remedial measures are applicable to single level cells and multi-level cells in order to compensate for the slow charge loss.

In FIG. 2, each graph 220A-220N shows a voltage distribution produced by memory cells programmed by a respective write level (which can be assumed to be at the midpoint of the distribution) to encode a corresponding logical level ("000" through "111" in case of a TLC). In order to distinguish between neighboring distributions (corresponding to two different logical levels), the threshold voltage levels (shown by dashed vertical lines) are defined, such that any measured voltage that falls below a threshold level is associated with one distribution of the pair of neighboring distributions, while any measured voltage that exceeds the threshold level is associated with another distribution of the pair of neighboring distributions.

As seen from comparing example charts 210 and 230, which reflect the time periods immediately after programming and 440 hours after programming, respectively, the voltage distributions change in time due to the slow charge loss, which results in drifting values of the threshold voltage levels, which are shown by dashed vertical lines.

As noted herein above, certain memory cells residing at known locations of the memory device (e.g., at known offsets within each memory page) are designated as "embedded servo cells," which, instead of storing the host data, are programmed to store known data patterns. The embedded servo cells may be programmed in groups of adjacent cells or as individual cells that are spread throughout the data cells of the memory device. Groups of embedded servo cells can be programmed at known threshold voltage offsets with respect to each other. Since the embedded servo cells are programmed at the same time as other cells of a given memory page, both embedded servo cells and regular data cells are presumed to exhibit similar threshold voltage distributions as the other cells.

In operation, upon receiving a read command, the memory sub-system controller determines the physical address corresponding to the logical block address (LBA) specified by the read command. Components of the physical address, such as the channel identifier, die identifier, page identifier, plane identifier and/or frame identifier, are utilized for identifying the physical location (e.g., the physical memory page) to be read and the corresponding locations of the embedded servo cells to be utilized for the read level calibration to be performed prior to the actual read operation.

Before performing the read operation, the controller (e.g., the local media controller 135 or the memory sub-system controller 115) decodes the embedded servo cells in order to compute appropriate voltage offsets to be applied to the base read levels in order to perform the read operation on the specified memory page. In other implementations, the calibration process can be performed periodically or in response to a certain triggering event, and the computed voltage offsets may be stored in the memory device metadata.

Figure 3:
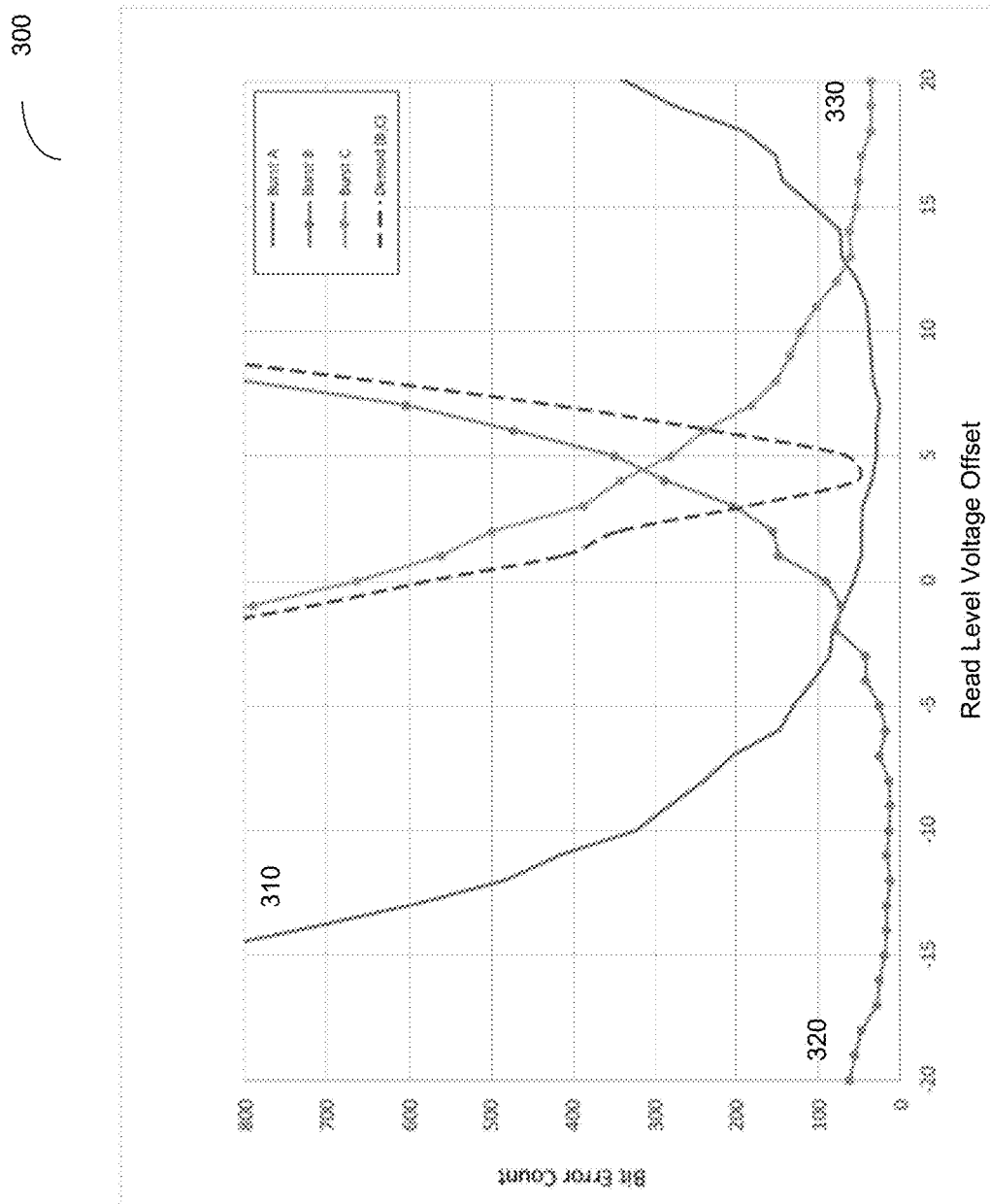
FIG. 3 depicts an example graph illustrating bit error count distributions over read voltage offsets for several groups of embedded servo cells, in accordance with some embodiments of the present disclosure.

FIG. 3 depicts an example graph 300 illustrating bit error count distributions over read voltage offsets for several groups of embedded servo cells. In the illustrative example of FIG. 3, the controller reads multiple groups of embedded servo cells (group A depicted by graph 310, group B depicted by graph 320, and group C depicted by graph 330) at various voltage offsets and computes the corresponding bit error count values. Since the groups of embedded servo cells store known data patterns, the bit error count computations may be performed very efficiently: the bit error count would be equal to the number of "1" bits in the result of performing a bitwise exclusive disjunction (XOR) operation of the known data pattern and the result of a read operation at the current read level offsets:

$$DBC = \sum_{j=0}^{N-1} (R_j \, XOR \, P_j)$$

where DBC denotes the differential bit count,
$R_j$ denotes the j-th bit of the read operation result, and
$P_j$ denotes the j-th bit of the known data pattern stored by the embedded servo cells.

Figure 4:
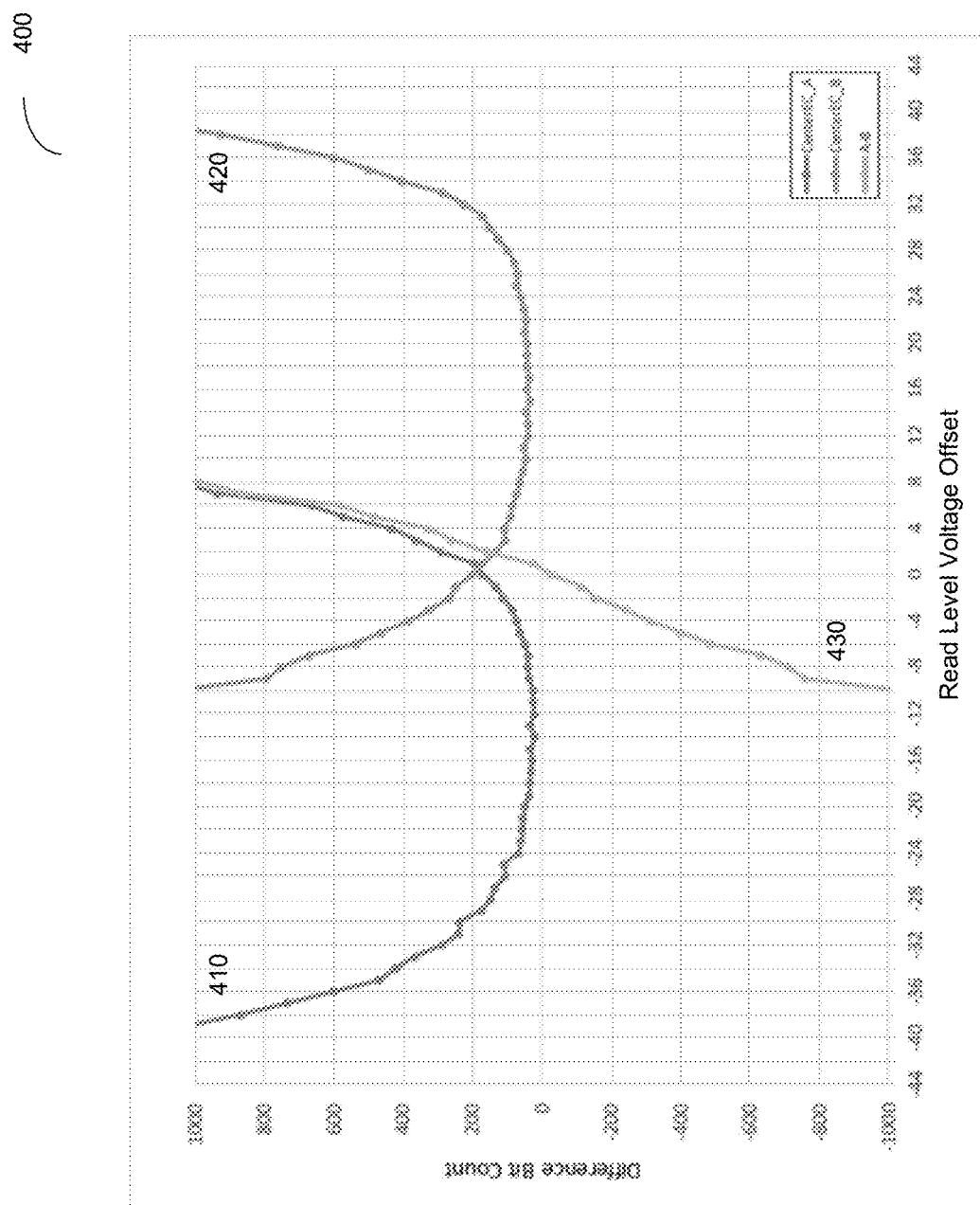
FIG. 4 schematically illustrates an example read level voltage computation based on differential bit count distributions for two groups of embedded servo cells, in accordance with some embodiments of the present disclosure.

The optimum read level offset can then be computed as the read level offset minimizing the differential bit count value, as schematically illustrated by FIG. 4, which shows an example read level voltage computation based on differential bit count distributions for two groups of embedded servo cells. As schematically illustrated by FIG. 4, the voltage read offset 430 is computed as being proportional to the difference of the read level offsets for the two groups of embedded servo cells 420 and 410:

$$\text{Offset} = K_{\text{off}} * (A - B)$$

where Offset denotes the read level voltage offset,

A and B denote the differential bit counts for the two groups of embedded servo cells corresponding to graphs 410 and 420, and $K_{\text{offs}}$ refers to the gain factor.

The gain factor can be determined based on two or more differential bit count values, for which the distance between the corresponding read level offsets is known:

$$K_{\text{offs}} = \frac{(A_1 - B_1) - (A_2 - B_2)}{RdOffset_1 - RdOffset_2}$$

where $(A_1-B_1)$ and $(A_2-B_2)$ are the differential bit count values for groups A and B of the embedded servo cells and $(RdOffset_1 - RdOffset_2)$ is the known difference between the corresponding read level offsets.

The computed read level offset can then be additively applied to the base read level for perform read operations, as described in more detail herein above.

Figure 5:
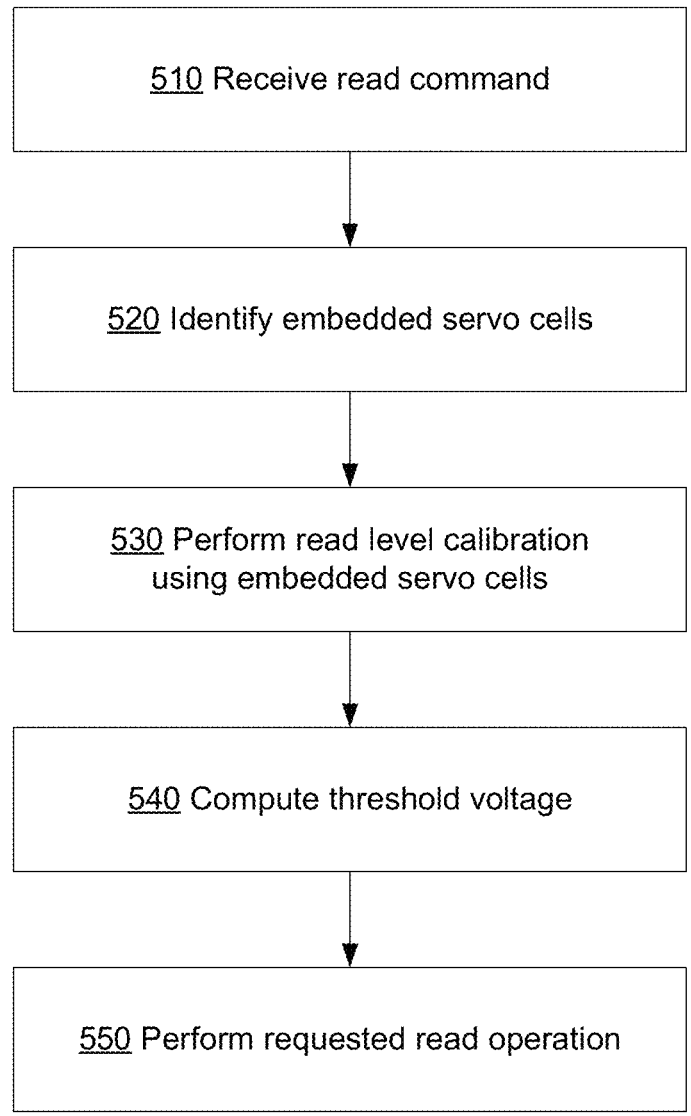
FIG. 5 is a flow diagram of an example method of performing read level calibration in memory devices using embedded servo cells in accordance with some embodiments of the present disclosure.

FIG. 5 is a flow diagram of an example method of performing read level calibration in memory devices using embedded servo cells in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the read level calibration component 113 of FIG. 1. As noted herein above, the functions of the read level calibration component 113 may be performed by the memory sub-system controller 115 or by the local media controller 135 of FIG. 1. Although shown in a particular sequence or order, unless otherwise specified, the order of the operations can be modified. Thus, the illustrated embodiments should be understood only as examples, and the illustrated operations can be performed in a different order, while some operations can be performed in parallel. Additionally, one or more operations can be omitted in some embodiments. Thus, not all illustrated operations are required in every embodiment, and other process flows are possible.

At operation 510, the processing device implementing the method receives a read command specifying a read operation to be performed.

At operation 520, the processing device identifies a set of embedded servo cells residing on the physical location of the memory device (e.g., on the physical memory page or memory block), with respect to which the read operation should be performed. In an illustrative example, the set of embedded servo cells may include one or more groups of embedded servo cells, such that each of the groups stores a known data pattern and is located at a respective known location of the memory device (e.g., at a respective known offset of the start of the physical memory page or memory block). The known embedded servo cell locations and the known data patterns stored by the embedded servo cells may be stored in the metadata area of the memory device. In some embodiments, the set of embedded servo cells may include at least two groups of embedded servo cells, such that the first group of embedded servo cells is programmed at a known threshold voltage offset with respect to the second group of embedded servo cells.

At operation 530, the processing device performs the read level calibration based on the set of embedded servo cells. In an illustrative example, the processing reads two groups of embedded servo cells (group A and group B) and computes the corresponding bit error count values. The voltage read offset is then computed as being proportional to the difference of the read level offsets for the two groups of embedded servo cells, as described in more detail herein above.

At operation 540, the processing device applies the identified threshold voltage offset to the base read level voltage associated with the memory device, thus computing the read level voltage to be utilized for performing the requested read operation. As noted herein above, the base read level voltage can be stored in the metadata area of the memory device.

At operation 550, the processing device performs the requested read operation using the computed read level voltage. In some embodiments, the processing device may store, in the metadata area of the memory device, the computed read level voltage in association with the current timestamp and the physical location (e.g., physical memory page of memory block) of the memory device, thus allowing for the computed read level voltage to be re-used within a certain period of time based on the stored timestamp. Responsive to completing operation 550, the method terminates.

Figure 6:
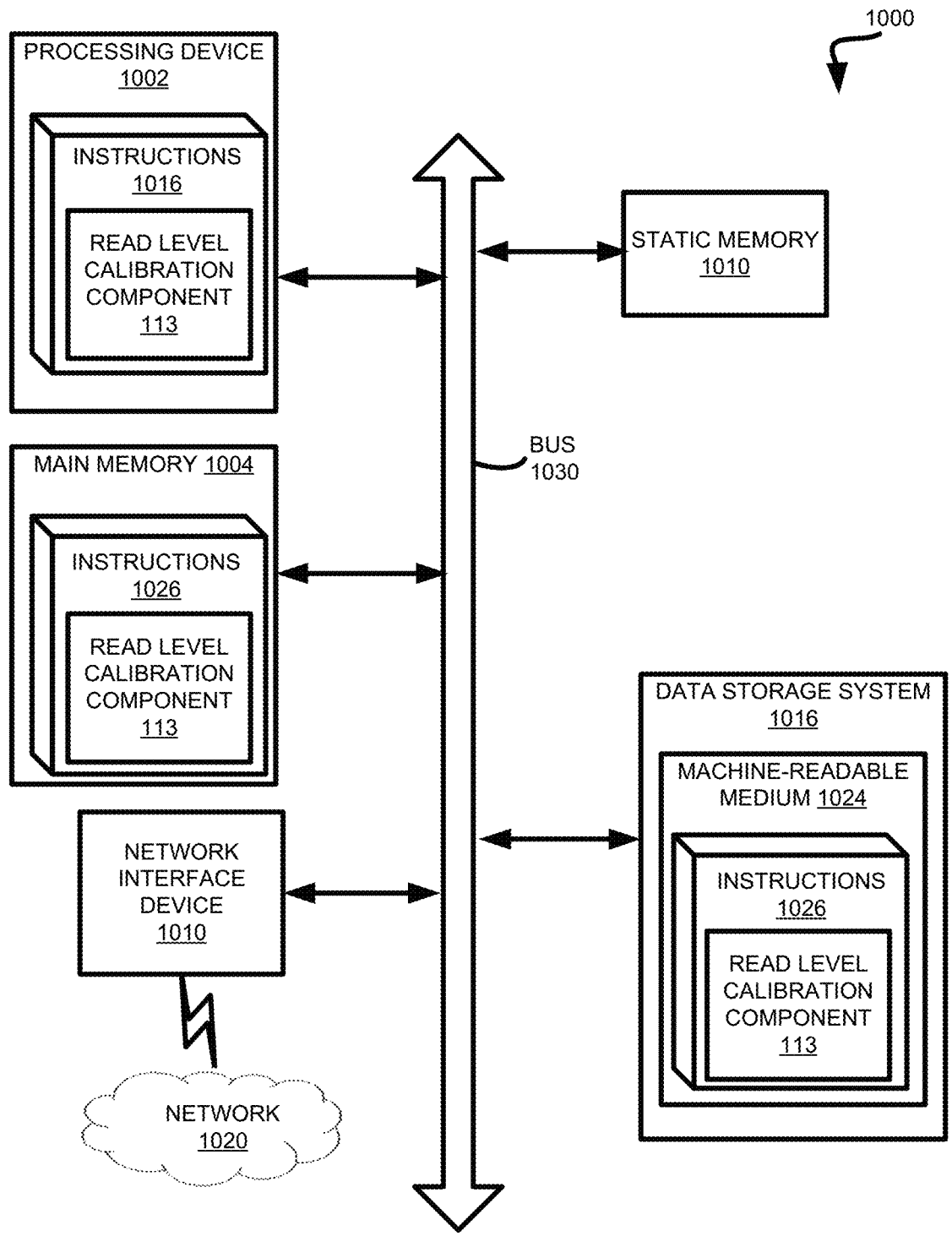
FIG. 6 is a block diagram of an example computer system in which embodiments of the present disclosure can operate.

FIG. 6 illustrates an example machine of a computer system 1000 within which a set of instructions, for causing the machine to perform any one or more of the methodologies discussed herein, can be executed. In some embodiments, the computer system 1000 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to perform operations of the read level calibration component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1000 includes a processing device 1002, a main memory 1004 (e.g., read-only memory (ROM), flash memory, dynamic random access memory (DRAM) such as synchronous DRAM (SDRAM) or Rambus DRAM (RDRAM), etc.), a static memory 1010 (e.g., flash memory, static random access memory (SRAM), etc.), and a data storage system 1016, which communicate with each other via a bus 1030.

Processing device 1002 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1002 can also be one or more special-purpose processing devices such as an application specific integrated circuit (ASIC), a field programmable gate array (FPGA), a digital signal processor (DSP), network processor, or the like. The processing device 1002 is configured to execute instructions 1026 for performing the operations and steps discussed herein. The computer system 1000 can further include a network interface device 10010 to communicate over the network 1020.

The data storage system 1016 can include a machine-readable storage medium 1024 (also known as a computer-readable medium) on which is stored one or more sets of instructions 1026 or software embodying any one or more of the methodologies or functions described herein. The instructions 1026 can also reside, completely or at least partially, within the main memory 1004 and/or within the processing device 1002 during execution thereof by the computer system 1000, the main memory 1004 and the processing device 1002 also constituting machine-readable storage media. The machine-readable storage medium 1024, data storage system 1016, and/or main memory 1004 can correspond to the memory sub-system 110 of FIG. 1.

In one embodiment, the instructions 1026 include instructions to implement functionality corresponding to the read level calibration component 113 of FIG. 1. While the machine-readable storage medium 1024 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system, comprising:
a memory device; and
a processing device, operatively coupled to the memory device, the processing device to perform operations, comprising:
   identifying a set of embedded servo cells stored on the memory device;
   computing a first value of a data state metric for a first group of embedded servo cells of the set of embedded servo cells;
   computing a second value of the data state metric for a second group of embedded servo cells of the set of embedded servo cells;
   determining a read voltage offset based on a difference of the first value of the data set metric and the second value of the data state metric; and applying the read voltage offset for reading a memory page associated with the set of embedded servo cells.

2. The system of claim 1, wherein the set of embedded servo cells comprises one or more groups of embedded servo cells, each group located at a respective known location on the memory device.

3. The system of claim 1, wherein the set of embedded servo cells comprises the first group of embedded servo cells and the second group of embedded servo cells, and wherein the first group of embedded servo cells is programmed at a known threshold voltage offset with respect to the second group of embedded servo cells.

4. The system of claim 1, wherein the first value of the data state metric is equal to a number of matching bits in the first group of embedded servo cells and a known data pattern stored by the first group of embedded servo cells.

5. The system of claim 1, wherein the operations further comprise:
receiving a read command specifying a logical address;
determining a physical address corresponding to logical address;
identifying, based on the physical address, a location of the set of embedded servo cells.

6. The system of claim 1, wherein the set of embedded servo cells comprises at least one of: one or more single level cells (SLC), one or more multiple level cells (MLC), or one or more triple level cells (TLC).

7. A memory device, comprising:
one or more dies comprising a plurality of memory cells; and
a processing device, operatively coupled to the plurality of memory cells, the processing device to perform operations, comprising:
identifying a set of embedded servo cells stored on the memory device, wherein the set of embedded servo cells comprises a first group of embedded servo cells and a second group of embedded servo cells, and wherein the first group of embedded servo cells is programmed at a known threshold voltage offset with respect to the second group of embedded servo cells;
responsive to receiving a read command, determining a read voltage offset by performing read level calibration based on the set of embedded servo cells; and
applying the read voltage offset for reading a memory page associated with the set of embedded servo cells.

8. The memory device of claim 7, wherein the set of embedded servo cells comprises one or more groups of embedded servo cells, each group located at a respective known location on the memory device.

9. The memory device of claim 7, wherein the set of embedded servo cells comprises one or more groups of embedded servo cells, and wherein performing the read level calibration further comprises:
computing a first value of a data state metric for the first group of embedded servo cells;
computing a second value of the data state metric for the second group of embedded servo cells;
computing the read voltage offset equal to a value which is proportional to a difference between the first value of the data state metric and the second value of the data state metric.

10. The memory device of claim 9, wherein the first value of the data state metric is equal to a number of matching bits in the first group of embedded servo cells and a known data pattern stored by the first group of embedded servo cells.

11. The memory device of claim 7, wherein the operations further comprise:
receiving a read command specifying a logical address;
determining a physical address corresponding to logical address;
identifying, based on the physical address, a location of the set of embedded servo cells.

12. The memory device of claim 7, wherein the set of embedded servo cells comprises at least one of: one or more single level cells (SLC), one or more multiple level cells (MLC), or one or more triple level cells (TLC).

13. A method, comprising:
identifying, by a processing device, a set of embedded servo cells stored on a memory device;
computing a first value of a data state metric for a first group of embedded servo cells of the set of embedded servo cells;
computing a second value of the data state metric for a second group of embedded servo cells of the set of embedded servo cells;
computing a read voltage offset equal to a value which is proportional to a difference between the first value of the data state metric and the second value of the data state metric; and
applying the read voltage offset for reading a memory page associated with the set of embedded servo cells.

14. The method of claim 13, wherein the set of embedded servo cells comprises at least one of: one or more single level cells (SLC), one or more multiple level cells (MLC), or one or more triple level cells (TLC).

15. The method of claim 13, further comprising:
receiving a read command specifying a logical address;
determining a physical address corresponding to logical address; and
identifying, based on the physical address, a location of the set of embedded servo cells.

16. The method of claim 13, wherein the read voltage offset is applied additively to a base read level associated with the memory page.

17. The method of claim 13, wherein the set of embedded servo cells comprises one or more groups of embedded servo cells, each group located at a respective known location on the memory device.

18. The method of claim 13, wherein the set of embedded servo cells comprises the first group of embedded servo cells and the second group of embedded servo cells, and wherein the first group of embedded servo cells is programmed at a known threshold voltage offset with respect to the second group of embedded servo cells.

* * * * *